(12) United States Patent  
Ito et al.

(10) Patent No.: US 10,768,524 B2  
(45) Date of Patent: Sep. 8, 2020

(54) PHOTOMASK BLANK SUBSTRATE CONTAINER, METHOD FOR STORING PHOTOMASK BLANK SUBSTRATE AND METHOD FOR TRANSPORTING PHOTOMASK BLANK SUBSTRATE

(71) Applicant: SHIN-ETSU CHEMICAL CO., LTD., Tokyo (JP)

(72) Inventors: Shogo Ito, Jyoetsu (JP); Ryuji Koitabashi, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 195 days.

(21) Appl. No.: 15/477,599

(22) Filed: Apr. 3, 2017

(65) Prior Publication Data

US 2017/0293220 A1    Oct. 12, 2017

(30) Foreign Application Priority Data

Apr. 7, 2016   (JP) ................. 2016-077010  
Feb. 2, 2017   (JP) ................. 2017-017635  
Mar. 15, 2017  (JP) ................. 2017-049655

(51) Int. Cl.  
*G03F 1/66* (2012.01)  
*H01L 21/673* (2006.01)  
(Continued)

(52) U.S. Cl.  
CPC .............. *G03F 1/66* (2013.01); *G03F 1/60* (2013.01); *H01L 21/67359* (2013.01);  
(Continued)

(58) Field of Classification Search  
CPC .......... G03F 1/60; G03F 1/66; G03F 7/70975; H01L 21/67376; H01L 21/67393; H01L 21/67359  
See application file for complete search history.

(56) References Cited

U.S. PATENT DOCUMENTS

| 5,330,053 A | 7/1994 | Tabuchi et al. |
| 2005/0006266 A1* | 1/2005 | Kurikawa ............... G03F 1/66 206/455 |
| 2016/0216603 A1 | 7/2016 | Suzuki et al. |

FOREIGN PATENT DOCUMENTS

| EP | 0774774 A2 | 5/1997 |
| EP | 1548820 A1 | 6/2005 |

(Continued)

OTHER PUBLICATIONS

Dec. 14, 2018 Office Action issued in European Patent Application No. 17000590.4.

(Continued)

*Primary Examiner* — Eli D. Strah  
(74) *Attorney, Agent, or Firm* — Oliff PLC

(57) ABSTRACT

A photomask blank substrate container having an inner member, inner cassette and retainer member, container main body having a lower box and an upper lid, and a sealing tape, in which the container main body and inner member include a polymer-based material in which when 0.1 g of a sample thereof is retained at 40° C. for 60 minutes to release an outgas component, the outgas total amount detected by a gas chromatography mass spectrometer is 1.9×103 ng or less in terms of n-tetra¬ decane, and the sealing tape is a material in which when a size of 10 mm×10 mm of a sample thereof is retained at 150° C. for 10 minutes to release an outgas component, the outgas total amount detected by a gas chromatography mass spectrometer is 1.8×103 ng or less in terms of n-tetradecane. This photomask blank substrate container allows storing and transporting the photomask blank substrate while suppressing influence on the resist pattern.

6 Claims, 2 Drawing Sheets

(51) Int. Cl.
*G03F 1/60* (2012.01)
*G03F 7/20* (2006.01)

(52) U.S. Cl.
CPC .. *H01L 21/67376* (2013.01); *H01L 21/67393* (2013.01); *G03F 7/70975* (2013.01)

(56) References Cited

FOREIGN PATENT DOCUMENTS

| | | |
|---|---|---|
| JP | H11-163115 A | 6/1999 |
| JP | 2005-031489 A | 2/2005 |
| JP | 2005-043796 A | 2/2005 |
| JP | 2005321532 A * | 11/2005 |
| JP | 2009217113 A * | 9/2009 |
| KR | 101147841 B1 * | 5/2012 |
| WO | 2015/037176 A1 | 3/2015 |

OTHER PUBLICATIONS

Aug. 22, 2017 Extended European Search Report issued in Patent Application No. 17000590.4.
Feb. 4, 2020 Office Action issued in Japanese Patent Application No. 2017-049655.

* cited by examiner

PHOTOMASK BLANK SUBSTRATE CONTAINER, METHOD FOR STORING PHOTOMASK BLANK SUBSTRATE AND METHOD FOR TRANSPORTING PHOTOMASK BLANK SUBSTRATE

TECHNICAL FIELD

The present invention relates to a photomask blank substrate container, a method for storing the photomask blank substrate and a method for transporting the photomask blank substrate.

BACKGROUND ART

The design rules of design circuits including semiconductors, etc., have been progressing further miniaturization of circuits year by year. Accompanied by this, with regard to the photomasks for forming circuits, the conditions required for the circuit pattern such as the line width, the shape and the pitch are increasingly strict.

As a forming method of a circuit, the photolithography method has heretofore been used, and as a resist composition for dealing with such miniaturization, a chemical amplification type resist suitable for a shorter wavelength and a higher resolution has widely been used.

The photolithography method using the chemical amplification type resist is a method for obtaining a desired circuit pattern in which a catalytic substance in the resist composition is formed by irradiation with light such as an excimer laser or irradiation of electron beam, and heat treatment is carried in the next step to react the catalytic substance and a polymer with each other, whereby the light or electron beam irradiated portion is solubilized (positive type) or insolubilized (negative type).

With regard to a photomask blank substrate container (hereinafter sometimes simply referred to as container) for storing or transporting a photomask blank substrate onto which a resist composition has been coated until the light or electron beam irradiation to the photomask blank substrate, light weight is desired since transportation or carrying is easy. In addition, a container using various polymer-based materials as a substrate, and produced by injection molding, etc., has conventionally been used in the points of being inexpensive and capable of being mass-produced.

However, various volatile components generating from the container comprising these polymer-based materials caused some influence on a catalytic action, a solubilizing action or insolubilizing action of the photoresist composition coated on the photomask blank substrate during storage or transportation of the photomask blank substrate. As a result, it sometimes caused inconvenience that, for example, a dimensional change such as enlargement or reduction of the line width was generated to the resist pattern on the photomask blank substrate formed by light or electron beam irradiation, heat treatment and development, and as a result, a pattern as designed could not be obtained.

To the problem caused by such a polymer-based material, it has been proposed a container comprising a thermoplastic resin in which an amount of caprolactam is 0.01 ppm or less in terms of n-decane per a weight of the resin by paying attention to the caprolactam in the outgas (for example, see Patent Literature 1).

CITATION LIST

Patent Literature

Patent Literature 1: WO2015/037176A

SUMMARY OF INVENTION

Technical Problem

However, in recent years, resolution and contrast performance required for resist has been increasing more and more, and it has become clear that control of dimensional change is insufficient in a conventional photomask blank substrate container. In addition, control of the outgas from the container has been attracted attention until now as a means for suppressing influence on a resist pattern; however, as a result of investigation by the present inventors, it was found that not only the volatile organic material components generated from the container made of a plastic, but also the volatile components generated from a sealing tape for the container also affect the resist pattern on the photomask blank substrate.

That is, in addition to the container for storing or transporting the photomask blank substrate, it has been found that control is required for the outgas of the sealing tape, and further improvement is required for the combination of the container and the sealing tape.

The present invention has been accomplished to solve the problems, and an object thereof is to provide a photomask blank substrate container, which is capable of storing and transporting the photomask blank substrate while suppressing the effect to the resist pattern on the contained photomask blank substrate.

Solution to Problem

To accomplish the objects, according to the present invention, it is provided a photomask blank substrate container for containing a photomask blank substrate, comprising an inner member having an inner cassette capable of containing the photomask blank substrate, and a retainer member for fixing the photomask blank substrate contained in the inner cassette from above, a container main body having a lower box capable of containing the inner cassette, and an upper lid capable of engaging with the retainer member to an inside, and a sealing tape for sealing the container main body, wherein the container main body and the inner member comprise a polymer-based material in which when 0.1 g of a sample thereof is retained at 40° C. for 60 minutes to release an outgas component, a total amount of the outgas detected by a gas chromatography mass spectrometer is $1.9 \times 10^3$ ng or less in terms of n-tetradecane, and the sealing tape is a material in which when a size of 10 mm×10 mm of a sample thereof is retained at 150° C. for 10 minutes to release an outgas component, a total amount of the outgas detected by a gas chromatography mass spectrometer is $1.8 \times 10^3$ ng or less in terms of n-tetradecane.

When such a material is employed, storage and transportation of the photomask blank substrate are possible while suppressing influence on the resist pattern by the volatile organic component generated from the container main body, the inner member and the sealing tape.

At this time, it is preferred that the container main body and the inner member comprise a polymer-based material in which when 0.1 g of a sample thereof is retained at 40° C. for 60 minutes to release an outgas component, the total amount of the outgas detected by a gas chromatography mass spectrometer is 500 ng or less in terms of n-tetradecane, the sealing tape is a material in which when a size of 10 mm×10 mm of a sample thereof is retained at 150° C. for 10 minutes to release an outgas component, the total amount of the outgas detected by a gas chromatography mass spectrometer is $1.0 \times 10^3$ ng or less in terms of n-tetradecane.

When such a material is employed, influence on the resist pattern by the volatile organic component generated from the container main body, the inner member and the sealing tape can be suppressed.

Also, at this time, it is preferred that the inner member comprises a polymer-based material in which when 2 g of a sample thereof is retained at 100° C. for 20 minutes to release an outgas component, the total, amount of the outgas detected by a gas chromatography mass spectrometer is $1.0 \times 10^3$ ng or less in terms of n-tetradecane.

When such a material is employed, influence on the resist pattern by the volatile organic component generated from the inner member provided in the container can be more certainly suppressed.

Further, at this time, it is preferred that the container main body comprises a polymer-based material containing a polycarbonate as a main component, and a surface resistance value thereof is $2.0 \times 10^4$ Ω/sq or less, and the sealing tape has a substrate comprising any of polyethylene terephthalate, polypropylene and polyethylene, and an adhesive surface comprising polyacrylic ester.

When such a material is employed, influence on the resist pattern by the volatile organic component generated from the container main body, the inner member and the sealing tape can be more certainly suppressed, and it is difficulty charged whereby adsorption of dust can be suppressed.

Moreover, at this time, a sum (the total amounts of the outgases in the container) of a total amount of outgas by outgas component generated from an inner surface of the container main body, and a total amount of outgas by outgas component generated from a surface of the inner member is less than $3.0 \times 10^3$ μg, and A total amount of outgas (the total amount of the outgas of the tape) by outgas component generated from the sealing tape sealing the container main body is less than $1.4 \times 10^2$ μg.

When such a material is employed, influence on the resist pattern by the volatile organic components generated from the inner surface of the container main body, the surface of the inner member and the sealing tape can be more certainly suppressed.

In addition, the present invention provides a method of storing a photomask blank substrate which comprises storing the photomask blank substrate with the photomask blank substrate contained in the photomask blank substrate container of the present invention. Moreover, the present invention provides a method of transporting a photomask blank substrate which comprises transporting the photomask blank substrate with the photomask blank substrate contained in the photomask blank substrate container of the present invention.

When the photomask blank substrate is stored and transported by using the photomask blank substrate container of the present invention as mentioned above, the photomask blank substrate can be stored and transported while suppressing influence on the resist pattern by the volatile organic component generated from the container main body, the inner member and the sealing tape.

Advantageous Effects of Invention

According to the present invention, the contained photomask blank substrate can be stored and transported while suppressing influence on the resist pattern by the volatile organic component generated from the container main body, the inner member and the sealing tape.

DESCRIPTION OF EMBODIMENTS

In the following, the embodiments of the present invention are explained, but the present invention is not limited by these.

As mentioned above, in recent years, resolution and contrast performance required for resist are increasing more and more, and there is a problem that control of dimensional change is insufficient in the conventional photomask blank substrate container.

Thus, the present inventors have intensively studied to solve the problems. As a result, they have found that, as a method for storing and transporting a photomask blank substrate onto which a chemical amplification type resist has been coated, by combining a container in which a total amount of the outgas generated from a polymer-based material constituting the container is a certain amount or less and a sealing tape in which a total amount of the outgas generating from the sealing tape is a certain amount or less, inconvenience caused in a line width of the resist pattern formed by subjecting to exposure, photosensitization and development after storage and transportation of the photomask blank substrate can be prevented, and a resist pattern with high precision can be obtained, whereby the present invention has been accomplished. Moreover, the best mode for carrying out these was carefully examined, and they have completed the present invention.

Figure 1:
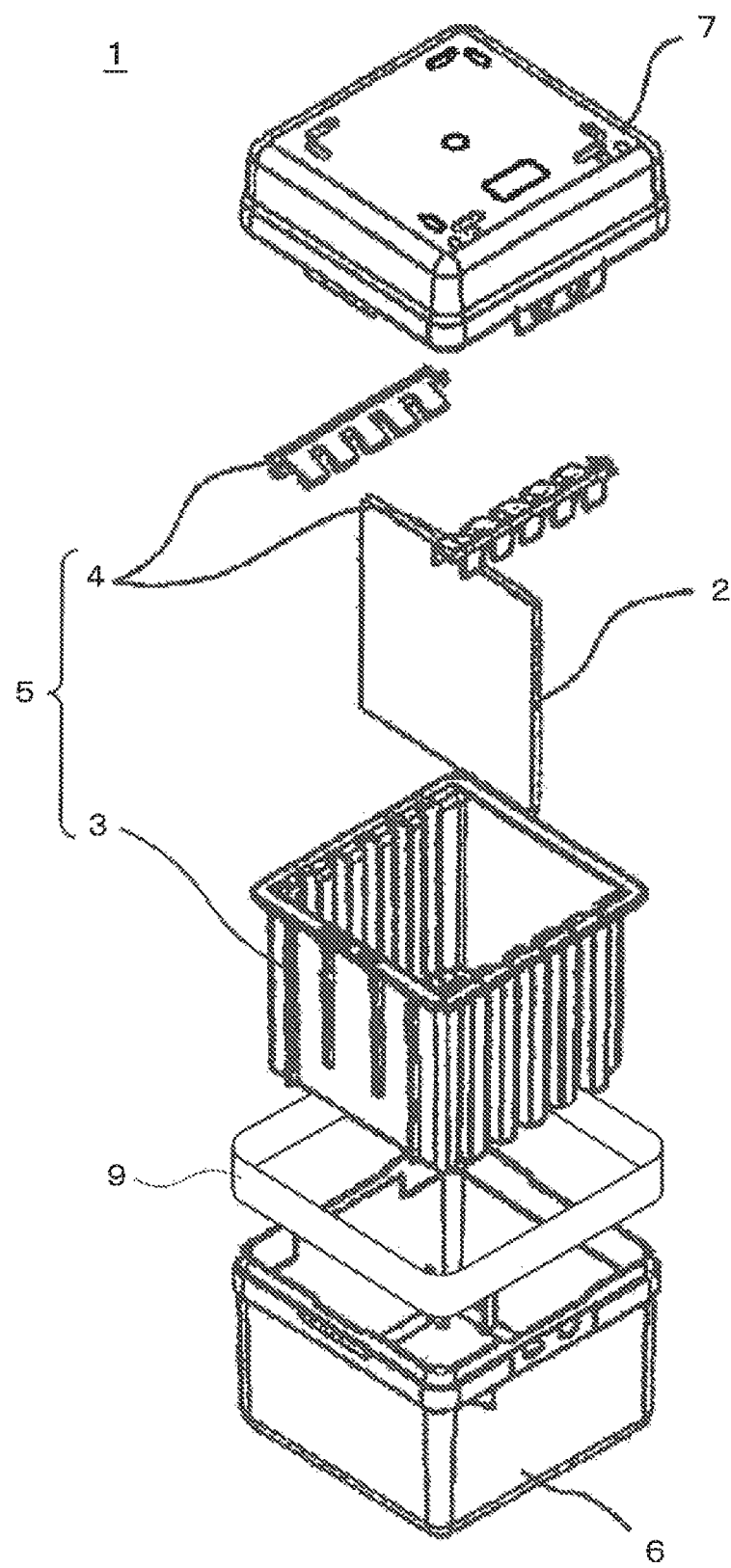
FIG. 1 is a schematic drawing showing an example of the photomask blank substrate container of the present invention.
Figure 2:
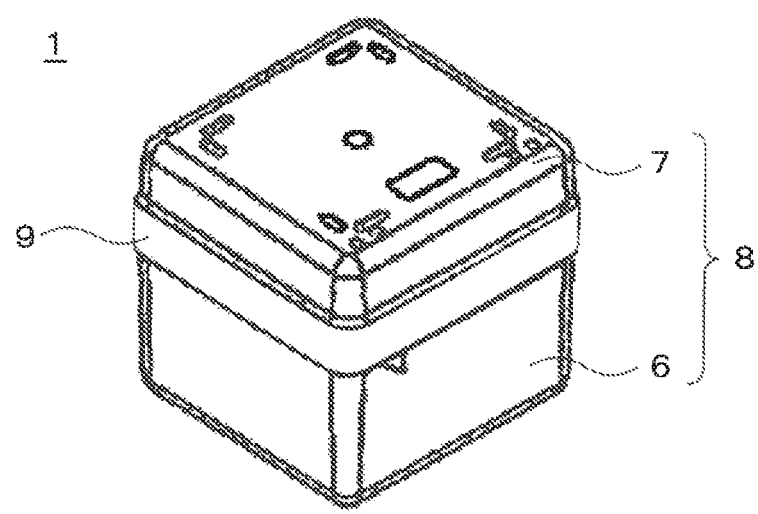
FIG. 2 is a schematic drawing showing the state in which a substrate is contained and taping is carried out by a sealing tape in the photomask blank substrate container of the present invention.

As shown in FIG. 1 and FIG. 2, the photomask blank substrate container 1 of the present invention comprises an inner member 5 having an inner cassette 3 capable of containing a photomask blank substrate 2, a retainer member 4 for fixing the photomask blank substrate 2 contained in the inner cassette 3 from above, a container main body 8 having a lower box 6 capable of containing the inner cassette 3, and an upper lid 7 capable of engaging with the retainer member 4 to an inside, and a sealing tape 9 sealing the container main body 8.

The inner cassette 3 can be made a material which is capable of containing the photomask blank substrates 2 by being stand in the vertical direction and being aligned at regular intervals.

The photomask blank substrate container 1 may be not limited to a container which contains a plurality of the photomask blank substrates 2 as mentioned above, but may be a single photomask blank substrate type container which contains the photomask blank substrate 2 one by one. Also, it may be a sealed type container which shuts off outside air or may be a container which is communicated with outside air through a chemical filter.

The photomask blank substrate 2 which is stored or transported by using the photomask blank substrate container 1 may be mentioned a material having a phase shift film, a material having a Cr light shielding film, etc., desirably a material onto which a chemical amplification type resist has been coated.

The container main body 8 and the inner member 5 each comprise a polymer-based material, in which when 0.1 g of a sample thereof is retained at 40° C. for 60 minutes to release an outgas component, a total amount of the outgas detected by a gas chromatography mass spectrometer is $1.9 \times 10^3$ ng or less in terms of n-tetradecane. Also, the sealing tape 9 is a material in which when a size of 10 mm×10 mm of a sample thereof is retained at 150° C. for 10 minutes to release an outgas component, a total amount of the outgas detected by a gas chromatography mass spectrometer is $1.8 \times 10^3$ ng or less in terms of n-tetradecane.

Additionally, materials of the container main body 8 and the inner member 5 may be the same polymer-based material, or may be different polymer-based materials. Additionally, materials of the lower box 6 and the upper lid 7 of the container main body 8 may be the same polymer-based material, or may be different polymer-based materials. Additionally, materials of the inner cassette 3 and the retainer member 4 of the inner member 5 may be the same polymer-based material, or may be different polymer-based materials.

In the present invention, when the components are made of different materials, each material is a polymer-based material that satisfies the above requirement. Sampling is performed for individual materials.

When such a photomask blank substrate container 1 using the container main body 8, the inner member 5 and the sealing tape 9 in combination is employed, it is possible to store or transport the photomask blank substrate 2 while suppressing influence on the resist pattern by the volatile organic component generated from the container main body 8, the inner member 5 and the sealing tape 9.

The polymer-based material which can be used for the lower box 6 and the upper lid 7, which constitute the container main body 8, and the inner cassette 3 and the retainer member 4, which constitute the inner member 5, may be mentioned, for example, polyethylene, polypropylene, polymethyl methacrylate, polycarbonate, polyethylene terephthalate, polybutylene terephthalate and an acrylonitrile-butadiene-styrene polymer, etc. These polymer-based materials are preferably used for the lower box 6, the upper lid 7, the inner cassette 3, and the retainer member 4, but the materials are not limited thereto.

At this time, the container main body 8 and the inner member 5 can each comprise a polymer-based material in which when 0.1 g of the sample thereof is retained at 40° C. for 60 minutes to release an outgas component, the total amount of the outgas detected by a gas chromatography mass spectrometer is $1.9 \times 10^3$ ng or less in terms of n-tetradecane, further preferably 500 ng or less, more preferably 100 ng or less, and most preferably 50 ng or less. Also, the sealing tape can be a material in which a size of 10 mm×10 mm of a sample thereof is retained at 150° C. for 10 minutes to release an outgas component, the total amount of the outgas detected by a gas chromatography mass spectrometer is $1.8 \times 10^3$ ng or less in terms of n-tetradecane, further preferably $1.0 \times 10^3$ ng or less.

When such a photomask blank substrate container 1 using the container main body 8, the inner member 5 and the sealing tape 9 in combination the total amounts of the outgas of which are little is employed, influence on the resist pattern by the volatile organic component generated from the container main body 8, the inner member 5 and the sealing tape 9 can be suppressed.

The polymer material with less amount of the releasing outgas may be mentioned, for example, polyethylene, polypropylene, polycarbonate and polyethylene terephthalate. The container is preferably constituted by a plural number of these resins.

Further, it is more preferred that the inner member 5 comprises at least one polymer-based material, and each of the at least one polymer-based material is a polymer-based material in which when 2 g of the sample thereof is retained at 100° C. for 20 minutes to release an outgas component, the total amount of the outgas detected by a gas chromatography mass spectrometer is $1.0 \times 10^3$ ng or less in terms of n-tetradecane.

The inner member 5 directly contacts with the photomask blank substrates 2 and all of the inner material 5 is provided in the container, so that by using the at least one material each having the total amount of the outgas to be detected being less as mentioned above, influence on the resist pattern by the volatile organic component generated from the inner member 5 can be more certainly suppressed.

At this time, one or more of the container main body 8 and the inner member 5 (in particular, the container main body 8) preferably comprise at least one polymer-based material containing a polycarbonate as a main component and the surface resistance value thereof is preferably $2.0 \times 10^4$ Ω/sq or less. Preferably, the surface resistance value of the container main body 8 is $2.0 \times 10^4$ Ω/sq or less. More preferably, the surface resistance values of the container main body 8 and the inner member 5 are $2.0 \times 10^4$ Ω/sq or less. When the surface resistance value is smaller, it is difficulty charged, so that static electricity can be suppressed, and adsorption of dust or contamination of particles can be prevented.

Further, the sealing tape 9 can be a material having a substrate and an adhesive surface. At this time, a material for the substrate of the sealing tape 9 may be mentioned, for example, a polyolefin-based, a polyester-based, polyvinyl chloride and Nylon, preferably comprises a material among any of polyethylene terephthalate, polypropylene and polyethylene. Moreover, a material for an adhesive surface of the sealing tape 9 may be mentioned, as an adhesive agent, for example, a polyacrylic ester-based, a polymethacrylate-based, polyvinyl acetate and a rubber-based, preferably a material comprising polyacrylic ester.

When such a sealing tape 9, and the container main body 8 and the inner member 5 having the surface resistance value as mentioned above are used in combination, influence on the resist pattern by the volatile organic component generated from the container main body 8, the inner member 5 and the sealing tape 9 can be certainly suppressed, it becomes difficulty charged, and adsorption of dust can be prevented.

In addition, the sealing tape 9 is desirably a material having high adhesive performance to prevent from inflow of the outside air into the container. Further, the sealing tape 9 having a high expansion rate and a high contraction rate is desired to make sealing and unsealing of the container easy.

Next, the method for storing and the method for transporting of a photomask blank substrate according to the present invention are explained. Here, the case where the photomask blank substrate container 1 of the present invention shown in FIGS. 1 and 2 as mentioned above is used is explained.

First, the inner cassette 3 is contained in the lower box 6, and the retainer member 4 is engaged with the upper lid 7. Then, the photomask blank substrates 2 are contained in the inner cassette 3, and the upper lid 7 is closed. Thereafter, the container main body 8 is sealed by the sealing tape 9. Then, in the state of containing the photomask blank substrates 2 in the photomask blank substrate container 1, the photomask blank substrates 2 are stored and transported. When the photomask blank substrates are stored and transported by using the photomask blank substrate container of the present invention as mentioned above, the photomask blank substrates 2 can be stored and transported while suppressing influence on the resist pattern by the volatile organic component generated from the container main body 8, the inner member 5 and the sealing tape 9.

The method for detecting the total amount of the outgas by gas chromatography mass spectrometer as mentioned above can be carried out, more specifically, as follows.

GC-MS Analysis Method
(Container Main Body and Inner Member)

0.1 g of a sample cut in a cubic shape from a part of the upper lid 7 of the container main body 8 is charged in a sample cell after accurately weighing, and the gas component is/are desorbed under high purity helium atmosphere and heating at 40° C. for 60 min. The generated gas component is/are analyzed by a gas chromatography mass spectrometer (GC-MS, Agilent GC7890A), and an area value of the detected peak is converted based on the calibration curve prepared by using n-tetradecane, whereby the total amount of the outgas (outgas amount from sample: x (ng)) of the polymer-based material constituting the container main body 8 can be obtained. This amount is defined as a total amount of the outgas of the container main body.

In the case where the container main body is made of more than one polymer-based material, the total amount of the outgas of the container main body is obtained from each polymer-based material.

For example, when the lower box 6 and the upper lid 7 of the container main body 8 are made of different polymer-based materials, the above analysis is performed on each polymer-based material, and the total amount of the outgas of the container main body (a total amount of the outgas of the container main body determined by a sample cut out from the upper lid 7 is expressed by $x_1$ (ng), and a total amount of the outgas of the container main body determined by a sample cut out from the lower box 6 is expressed by $x_2$ (ng)) is obtained from each polymer-based material.

0.1 g of a sample similarly cut in a cubic shape from a part of the inner member 5 is charged in a sample cell after accurately weighing, and the gas component is/are desorbed under high purity helium atmosphere and heating at 40° C. for 60 min. The generated gas component is/are analyzed by a gas chromatography mass spectrometer (GC-MS, Agilent GC7890A), and an area value of the detected peak is converted based on the calibration curve prepared by using n-tetradecane, whereby the total amount of the outgas (outgas amount from sample: y (ng)) of the polymer-based material constituting the inner member 5 can be obtained. This amount is defined as a total amount of the outgas of the inner member.

In the case where the inner member is made of more than one polymer-based material, the total amount of the outgas of the inner member is obtained from each polymer-based material.

For example, when the inner cassette 3 and the retainer member 4 of the inner member 5 are made of different polymer-based materials, the above analysis is performed on each polymer-based material, and the total amount of the outgas of the inner member (a total amount of the outgas of the inner member determined by a sample cut out from the inner cassette 3 is expressed by $y_1$ (ng), and a total amount of the outgas of the inner member determined by a sample cut out from the retainer member 4 is expressed by $y_2$ (ng)) is obtained from each polymer-based material.

Further, based on these results, a total amount of outgas by outgas component generated from a corresponding inner surface of the container main body, and a total amount of outgas by outgas component generated from a corresponding surface of the inner member are obtained, respectively, and the sum is defined to be a total amount of outgas by outgas component generated from an inner surface of the container main body and a surface of the inner member at which the photomask blank substrates are exposed in the container. In the following, it is defined to be the total amount of the outgas in the container.

More specifically, the inner surface (B ($mm^2$)) of the container main body is divided by the surface area (A ($mm^2$)) of the sample, and multiplied the outgas amount from the sample to calculate the total amount of the outgas from the inner surface of the container main body (($B/A) \times x$ (ng)).

Next, the surface area (D ($mm^2$)) of the inner member is divided by the surface area (C ($mm^2$)) of the sample, and multiplied the outgas amount from the sample to calculate the total amount of the outgas from the surface of the inner member (($D/C) \times y$ (ng)).

From the sum $\{(B/A) \times x + (D/C) \times y\}$ (ng) of these, the total amount of the outgas in the container can be obtained.

In general, when the container main body is made of more than one polymer-based material, while the inner member is made of more than one polymer-based material, the total amount of the outgas in the container is expressed by the following formula:

$$\{\Sigma^n_{k=1}(B_k/A_k) \times x_k + \Sigma^m_{l=1}(D_l/C_l) \times y_l\} (\text{ng})$$

This formula indicates that the container main body 8 is made of n number of polymer-based materials, and the inner member 5 is made of m number of polymer-based materials.

The total amount of the outgas in the container is preferably less than $3.0 \times 10^3$ μg, more preferably $8.0 \times 10^2$ μg or less, further preferably $6.5 \times 10^2$ μg or less.

(Inner Member)

From the inner member 5, 2 g of the sample is collected, and the outgas component is/are adsorbed to an adsorption tube TENAX-TA and collected by using a curie point purge & trap sampler (JHS-100A manufactured by Japan Analytical Industry Co., Ltd.) by retaining the sample at 100° C. for 20 min while flowing a carrier gas: He. The adsorbed outgas component is/are analyzed by a gas chromatography mass spectrometer (GC-MS, Agilent 5975C-MSD), and an area value of the detected peak is converted based on the calibration curve prepared by using n-tetradecane, whereby the total amount of the outgas of the inner member 5 can be obtained.

(Sealing Tape)

A sample in which the sealing tape 9 is cut with a size of 10 mm×10 mm is retained at 150° C. for 10 min while flowing a carrier gas: He, and the outgas component is adsorbed and collected by using a curie point purge & trap sampler (JHS-100A manufactured by Japan Analytical Industry Co., Ltd.). The adsorbed outgas component is/are analyzed by a gas chromatography mass spectrometer (GC-MS, Agilent 5975C-MSD), and an area value of the detected peak is converted based on the calibration curve prepared by using n-tetradecane, whereby the total amount of the outgas (an outgas amount from the sample: z (ng)) of the sealing tape can be obtained. This amount is defined as a total amount of the outgas of the sealing tape.

Also, the total amount of the outgas generated from the sealing tape when the periphery of the container main body is subjected to taping is obtained from the results, which is hereinafter defined to be a total amount of the outgas of the tape.

More specifically, a width of the sealing tape used at this time is all 10 mm. The total length of the tape for sealing the container main body is made E (mm). Next, the total amount of the outgas ($\{(10\times E)/(10\times 10)\}\times z$ (ng)) of the tape dissipated from an area ($10\times E$ (mm$^2$)) of the used sealing tape is calculated. The total length of the tape means a length corresponding to the whole circumference of the container main body. When the container main body is sealed with the sealing tape over the whole circumference, the sealing tape is applied such that a part of the sealing tape overlaps with an already wound part, but the total length does not include the overlapped length.

The total amount of the outgas of the tape is preferably less than $1.4\times 10^2$ μg, more preferably $1.0\times 10^2$ μg or less, further preferably $7.5\times 10$ μg or less.

Incidentally, the GC-MS measurement conditions can be set, for example, as follows.
[GC-MS Measurement Conditions (the Container Main Body, the Inner Member)]
Measurement method: Dynamic head space method
Column: DB-1 (30 m×0.32 mm φ×0.25 μm)
Temperature: 50° C. for 3 min (10° C./min) 250° C. for 12 min
[GC-MS Measurement Conditions (the Inner Member, the Sealing Tape)]
Measurement method: Purge & trap method
Column: DB-5MS (30 m×0.25 mm φ×0.25 μm)
Temperature: 40° C. for 5 min (10° C./min) 300° C. for 5 min

EXAMPLES

In the following, the present invention is more specifically explained by referring to Examples of the present invention and Comparative examples, but the present invention is not limited by these.

Example 1

As the container main body, as shown in FIG. 1, two parts of the upper lid 7 and the lower box 6, which are capable of containing the inner cassette 3 capable of standing a plurality of 152 mm square photomask blank substrates 2 were produced by the injection molding using a polycarbonate-based resin A.

On the flat portion of the flat surface of the upper lid 7 thus produced, the surface resistance value was measured by using a surface resistance measuring device (manufactured by Mitsubishi Chemical Corporation), and as a result, the surface resistance value thereof was $2.0\times 10^4$ Ω/sq.

Also, 0.1 g of a sample was cut from a part of the upper lid 7, charged in a sample cell after accurately weighing, retained at 40° C. for 60 min under high purity helium atmosphere to carry out heating and desorption, and the generated gas component was analyzed by a gas chromatography mass spectrometer (GC-MS, Agilent GC7890A) under the following conditions. At this time, the area value of the detected peak was converted based on the calibration curve prepared by using n-tetradecane, whereby the total amount of the outgas of the polymer-based material constituting the container main body was obtained. As a result, a total amount of detected outgas was 18 ng in terms of n-tetradecane. Also, 0.1 g of the inner member similarly measured was analyzed, and as a result, a total amount of detected outgas was 9 ng in terms of n-tetradecane. The total amount of the outgas in the container obtained therefrom was 37 μg.

[GC-MS Measurement Conditions (the Container Main Body, the Inner Member)]
Measurement method: Dynamic head space method
Column: DB-1 (30 m×0.32 mmφ×0.25 μm)
Temperature: 50° C. for 3 min (10° C./min) 250° C. for 12 min Also, as the inner member 5, an inner cassette 3 capable of standing a plurality of 152 mm square photomask blank substrates 2, and a retainer member 4 capable of engaging with an inside of the upper lid 7 and fixing the respective photomask blank substrates 2 from above contained in the inner cassette 3 when the upper lid 7 is engaged with the lower box 6, were produced by the injection molding using the same polybutylene terephthalate resin.

2 g of the inner member was retained at 100° C. for 20 min and an outgas component was adsorbed to an adsorption tube TENAX-TA and collected by using a curie point purge & trap sampler (JHS-100A manufactured by Japan Analytical Industry Co., Ltd.) while flowing a carrier gas: He. The adsorbed outgas component was analyzed by a gas chromatography mass spectrometer (GC-MS, Agilent 5975C-MSD) under the following conditions. At this time, the area value of the detected peak was converted based on the calibration curve prepared by using n-tetradecane, whereby the total amount of the outgas of the inner member 5 was obtained. As a result, a total amount of detected outgas was $1.3\times 10^2$ ng in terms of n-tetradecane.

As the sealing tape, a sealing tape A in which the substrate is a polyethylene terephthalate-based material and an adhesion surface is a polyacrylic ester was used.

The sealing tape A was cut with a size of 10 mm×10 mm, and the outgas component was/were adsorbed and collected by using a curie point purge & trap sampler (JHS-100A manufactured by Japan Analytical Industry Co., Ltd.) by retaining the sample at 150° C. for 10 min while flowing a carrier gas: He. The adsorbed outgas component was analyzed by a gas chromatography mass spectrometer (GC-MS, Agilent 5975C-MSD) under the following conditions, and the area value of the detected peak was converted based on the calibration curve prepared by using n-tetradecane to obtain the total amount of the outgas of the sealing tape 9. As a result, in the sealing tape A, a total amount of detected outgas was $5.3\times 10^2$ ng in terms of n-tetradecane. The total amount of the outgas of the tape obtained therefrom was 40 μg.

[GC-MS Measurement Conditions (the Inner Member, the Sealing Tape)]
Measurement method: Purge & trap method
Column: DB-5MS (30 m×0.25 mmφ×0.25 μm)
Temperature: 40° C. for 5 min (10° C./min) 300° C. for 5 min Then, three sheets of the photomask blank substrates 2 on which a chemical amplification type resist has been coated were contained in the photomask blank substrate container 1 which had been assembled by the upper lid 7, the lower box 6, the inner cassette 3 and the retainer member 4 produced as mentioned above. Thereafter, the container was subjected to taping with the sealing tape A so as to cover the gaps between the upper lid 7 and the lower box 6.

Then, the container main body was stored in a thermostat chamber at 40° C. in the state that it was subjected to taping with the sealing tape A. After the storage for 20 days, it was subjected to EB drawing, baking and developing, to form a resist pattern with L/S (line & space) of a line width of 400 nm and the space width was measured.

Also, the photomask blank substrates onto which a resist had been similarly coated were subjected to EB drawing, baking and developing without containing in the container, and the difference in the space width of the resist pattern from that of the photomask blank substrates 2 stored in the container was defined to be ΔCD, and the value of the ΔCD was obtained.

As a result, the ΔCD value in Example 1 was +1.0 nm with 20 days, and it was mostly not influenced by the container and the sealing tape.

Example 2

A photomask blank substrate container was produced in the same conditions as in Example 1 except for using a sealing tape B in which the substrate was a polypropylene-based resin and the adhesive surface was polyacrylic ester as the sealing tape.

The total amount of the outgas of the sealing tape B was analyzed by GC-MS in the same manner as in Example 1. As a result, a total amount of detected outgas of the sealing tape B was $9.3 \times 10^2$ ng in terms of n-tetradecane. The total amount of the outgas of the tape obtained therefrom was 71 μg.

The container main body of Example 2 into which the photomask blank substrates had been contained was stored at 40° C. for 20 days in the same manner as in Example 1 with the state that the container had been subjected to taping with the sealing tape B.

The photomask blank substrates after storage was subjected to EB drawing, baking and developing in the same manner as in Example 1, and the obtained pattern was measured. As a result, the ΔCD value in Example 2 was +0.3 nm, and it was mostly not influenced by the container and the sealing tape.

Example 3

A photomask blank substrate container was produced in the same manner as in Example 1 except for using a sealing tape C in which the substrate was a polyethylene-based resin and the adhesive surface was polyacrylic ester as the sealing tape.

The total amount of the outgas of the sealing tape C was analyzed by GC-MS in the same manner as in Example 1. As a result, a total amount of detected outgas of the sealing tape C was $7.2 \times 10^2$ ng in terms of n-tetradecane. The total amount of the outgas of the tape obtained therefrom was 55 μg.

The container main body of Example 3 into which the photomask blank substrates had been contained was stored at 40° C. for 20 days in the same manner as in Example 1 with the state that the container had been subjected to taping with the sealing tape C.

The photomask blank substrates after storage was subjected to EB drawing, baking and developing in the same manner as in Example 1, and the obtained pattern was measured. As a result, the ΔCD value in Example 3 was −0.3 nm, and it was mostly not influenced by the container and the sealing tape.

Example 4

A photomask blank substrate container was produced in the same manner as in Example 1.

The container main body of Example 4 into which the photomask blank substrates had been contained was stored at normal temperature for three months (90 days) with the state that the container had been subjected to taping with the sealing tape A.

The photomask blank substrates after storage was subjected to EB drawing, baking and developing in the same manner as in Example 1, and the obtained pattern was measured. As a result, the ΔCD value in Example 4 was +0.2 nm, and it was mostly not influenced by the container and the sealing tape.

Example 5

A photomask blank substrate container was produced in the same manner as in Example 2.

The container main body of Example 5 into which the photomask blank substrates had been contained was stored at normal temperature for three months (90 days) in the same manner as in Example 4 with the state that the container had been subjected to taping with the sealing tape B.

The photomask blank substrates after storage was subjected to EB drawing, baking and developing in the same manner as in Example 1, and the obtained pattern was measured. As a result, the ΔCD value in Example 5 was −0.8 nm, and it was mostly not influenced by the container and the sealing tape.

Example 6

A photomask blank substrate container was produced in the same conditions as in Example 1 except for using a polycarbonate-based resin B for the materials of the upper lid and the lower box as the polymer-based material of the container main body.

The total amount of the outgas of the polycarbonate-based resin B was analyzed by GC-MS in the same manner as in Example 1. As a result, in the polycarbonate-based resin B, a total amount of detected outgas was 21 ng in terms of n-tetradecane. Also, similar to Example 1, a total amount of detected outgas of the inner member was 9 ng in terms of n-tetradecane. Thus, the total amount of the outgas in the container was 42 μg.

The container main body of Example 6 into which the photomask blank substrates had been contained was stored at normal temperature for three months (90 days) in the same manner as in Example 4 with the state that the container had been subjected to taping with the sealing tape A.

The photomask blank substrates after storage was subjected to EB drawing, baking and developing in the same manner as in Example 1, and the obtained pattern was measured. As a result, the ΔCD value in Example 6 was −0.1 nm, and it was mostly not influenced by the container and the sealing tape.

Example 7

A photomask blank substrate container was produced in the same conditions as in Example 1 except for using a polycarbonate-based resin C for the materials of the upper lid and the lower box as the polymer-based material of the container main body.

The total amount of the outgas of the polycarbonate-based resin C was analyzed by GC-MS in the same manner as in Example 1. As a result, in the polycarbonate-based resin C, a total amount of detected outgas was 34 ng in terms of n-tetradecane. Thus, the total amount of the outgas in the container was 61 μg.

The container main body of Example 7 into which the photomask blank substrates had been contained was stored at normal temperature for three months (90 days) in the same manner as in Example 4 with the state that the container had been subjected to taping with the sealing tape A.

The photomask blank substrates after storage was subjected to EB drawing, baking and developing in the same manner as in Example 1, and the obtained pattern was measured. As a result, the ΔCD value in Example 7 was +0.5 nm, and it was mostly not influenced by the container and the sealing tape.

Example 8

A photomask blank substrate container was produced in the same conditions as in Example 1 except for using a polypropylene-based resin D for the materials of the upper lid and the lower box as the polymer-based material of the container main body.

The total amount of the outgas of the polypropylene-based resin D was analyzed by GC-MS in the same manner as in Example 1. As a result, in the polypropylene-based resin D, a total amount of detected outgas was $4.9 \times 10^2$ ng in terms of n-tetradecane. Thus, the total amount of the outgas in the container was 635 μg ($6.4 \times 10^2$ μg).

The container main body of Example 8 into which the photomask blank substrates had been contained was stored at normal temperature for three months (90 days) in the same manner as in Example 4 with the state that the container had been subjected to taping with the sealing tape A.

The photomask blank substrates after storage was subjected to EB drawing, baking and developing in the same manner as in Example 1, and the obtained pattern was measured. As a result, the ΔCD value in Example 8 was −1.2 nm, and it was mostly not influenced by the container and the sealing tape. The results of Examples 1 to 8 mentioned above were summarized in the following Table 1.

TABLE 1

| | | Example 1 | Example 2 | Example 3 | Example 4 | Example 5 | Example 6 | Example 7 | Example 8 |
|---|---|---|---|---|---|---|---|---|---|
| Container main body (upper lid, lower box) | Sample | Resin A | Resin A | Resin A | Resin A | Resin A | Resin B | Resin C | Resin D |
| | Base resin | Polycarbonate-based | Polycarbonate-based | Polycarbonate-based | Polycarbonate-based | Polycarbonate-based | Polycarbonate-based | Polycarbonate-based | Polypropylene-based |
| | Total amount of (40° C. × 60 min)/in terms of n-tetradecane ng | 18 | 18 | 18 | 18 | 18 | 21 | 34 | $4.9 \times 10^2$ |
| Inner member (inner cassette, retainer member) | Base resin | Polybutylene terephthalate-based | Polybutylene terephthalate-based | Polybutylene terephthalate-based | Polybutylene terephthalate-based | Polybutylene terephthalate-based | Polybutylene terephthalate-based | Polybutylene terephthalate-based | Polybutylene terephthalate-based |
| | Total amount of outgas (40° C. × 60 min)/in terms of n-tetradecane ng | 9 | 9 | 9 | 9 | 9 | 9 | 9 | 9 |
| | Total amount of outgas (100° C. × 20 min)/in terms of n-tetradecane ng | $1.3 \times 10^2$ | $1.3 \times 10^2$ | $1.3 \times 10^2$ | $1.3 \times 10^2$ | $1.3 \times 10^2$ | $1.3 \times 10^2$ | $1.3 \times 10^2$ | $1.3 \times 10^2$ |
| Sealing tape | Sample | Sealing tape A | Sealing tape B | Sealing tape C | Sealing tape A | Sealing tape B | Sealing tape A | Sealing tape A | Sealing tape A |
| | Substrate | Polyethylene terephthalate-based | Polypropylene-based | Polyethylene-based | Polyethylene terephthalate-based | Polypropylene-based | Polyethylene terephthalate-based | Polyethylene terephthalate-based | Polyethylene terephthalate-based |
| | Adhesive surface | Polyacrylic ester-based | Polyacrylic ester-based | Polyacrylic ester-based | Polyacrylic ester-based | Polyacrylic ester-based | Polyacrylic ester-based | Polyacrylic ester-based | Polyacrylic eater-based |
| | Total amount of outgas | $5.3 \times 10^2$ | $9.3 \times 10^2$ | $7.2 \times 10^2$ | $5.3 \times 10^2$ | $9.3 \times 10^2$ | $5.3 \times 10^2$ | $5.3 \times 10^2$ | $5.3 \times 10^2$ |

TABLE 1-continued

|  |  | Example 1 | Example 2 | Example 3 | Example 4 | Example 5 | Example 6 | Example 7 | Example 8 |
|---|---|---|---|---|---|---|---|---|---|
|  | (150° C. × 10 min)/in terms of n-tetradecane ng |  |  |  |  |  |  |  |  |
| Total amount of outgas in container µg |  | 37 | 37 | 37 | 37 | 37 | 42 | 61 | 635 |
| Total amount of outgas of tape µg |  | 40 | 71 | 55 | 40 | 71 | 40 | 40 | 40 |
| Storage conditions | stored days/day | 20 | 20 | 20 | 90 | 90 | 90 | 90 | 90 |
|  | stored temperature/° C. | 40 | 40 | 40 | 23 | 23 | 23 | 23 | 23 |
| Line width changed amount ΔCD/nm |  | 1.0 | 0.3 | −0.3 | 0.2 | −0.8 | −0.1 | 0.5 | −1.2 |

Comparative Example 1

A photomask blank substrate container was produced in the same manner as in Example 1 except for using a methyl methacrylate-based resin E for the materials of the upper lid and the lower box as the container main body.

The total amount of the outgas of the methyl methacrylate-based resin E was analyzed by GC-MS in the same manner as in Example 1. As a result, a total amount of detected outgas of the methyl methacrylate-based resin E was $2.0 \times 10^3$ ng in terms of n-tetradecane. Thus, the total amount of the outgas in the container was 3,032 µg.

The container main body of Comparative example 1 into which the photomask blank substrates had been contained was stored at 40° C. for 20 days in the same manner as in Example 1 with the state that the container had been subjected to taping with the sealing tape A.

The photomask blank substrates after storage was subjected to EB drawing, baking and developing in the same manner as in Example 1, and the obtained pattern was measured. As a result, the ΔCD value in Comparative example 1 was +7.4 nm, and it was influenced by the container.

Comparative Example 2

A photomask blank substrate container was produced in the same conditions as in Example 1 except for using a sealing tape D in which the substrate was a polyvinyl chloride-based resin and an adhesive surface was a natural rubber-based material as the sealing tape.

The total amount of the outgas of the sealing tape D was analyzed by GC-MS in the same manner as in Example 1. As a result, a total amount of detected outgas of the sealing tape D was $1.7 \times 10^4$ ng in terms of n-tetradecane. The total amount of the outgas of the tape obtained therefrom was 1,291 µg ($1.3 \times 10^3$ µg).

The container main body of Comparative example 2 into which the photomask blank substrates had been contained was stored at 40° C. for 20 days in the same manner as in Example 1 with the state that the container had been subjected to taping with the sealing tape D.

The photomask blank substrates after storage was subjected to EB drawing, baking and developing in the same manner as in Example 1, and the obtained pattern was measured. As a result, the ΔCD value in Comparative example 2 was −12.9 nm, and it was influenced by the sealing tape.

Comparative Example 3

A photomask blank substrate container was produced in the same conditions as in Example 1 except for using a sealing tape E in which the substrate was a polyethylene-based resin and an adhesive surface was polyacrylic ester as the sealing tape.

Also, the total amount of the outgas of the sealing tape E was analyzed by GC-MS in the same manner as in Example 1. As a result, a total amount of detected outgas of the sealing tape E was $1.9 \times 10^3$ ng in terms of n-tetradecane. The total amount of the outgas of the tape obtained therefrom was 144 µg ($1.4 \times 10^2$ µg).

The container main body of Comparative example 3 into which the photomask blank substrates had been contained was stored at 40° C. for 20 days in the same manner as in Example 1 with the state that the container had been subjected to taping with the sealing tape E.

The photomask blank substrates after storage was subjected to EB drawing, baking and developing in the same manner as in Example 1, and the obtained pattern was measured. As a result, the ΔCD value in Comparative example 3 was −3.9 nm, and it was influenced by the sealing tape.

Comparative Example 4

A photomask blank substrate container was produced in the same conditions as in Example 1 except for using a sealing tape F in which the substrate was a polyethylene-based resin and the adhesive surface was polyacrylic ester as the sealing tape.

The total amount of the outgas of the sealing tape F was analyzed by GC-MS in the same manner as in Example 1. As a result, a total amount of detected outgas of the sealing tape F was $2.4 \times 10^3$ ng in terms of n-tetradecane. The total amount of the outgas of the tape obtained therefrom was 182 µg ($1.8 \times 10^2$ µg).

The container main body of Comparative example 4 into which the photomask blank substrates had been contained was stored at 40° C. for 20 days in the same manner as in Example 1 with the state that the container had been subjected to taping with the sealing tape F.

The photomask blank substrates after storage was subjected to EB drawing, baking and developing in the same manner as in Example 1, and the obtained pattern was measured. As a result, the ΔCD value in Comparative example 4 was −2.3 nm, and it was influenced by the sealing tape.

Comparative Example 5

A photomask blank substrate container was produced in the same manner as in Comparative example 2.

The container main body of Comparative example 5 into which the photomask blank substrates had been contained was stored at normal temperature for three months (90 days) with the state that the container had been subjected to taping with the sealing tape D.

The photomask blank substrates after storage was subjected to EB drawing, baking and developing in the same manner as in Example 1, and the obtained pattern was measured. As a result, the ΔCD value in Comparative example 5 was −2.4 nm, and it was influenced by the sealing tape.

Comparative Example 6

A photomask blank substrate container was produced in the same conditions as in Example 1 except for using an acrylonitrile-butadiene-styrene-based resin F as materials for the upper lid and the lower box of the container main body.

The total amount of the outgas of the acrylonitrile-butadiene-styrene-based resin F was analyzed by GC-MS in the same manner as in Example 1. As a result, a total amount of detected outgas of the acrylonitrile-butadiene-styrene-based resin F was $5.2 \times 10^3$ ng. Thus, the total amount of the outgas in the container was 7,259 μg.

The container main body of Comparative example 6 into which the photomask blank substrates had been contained was stored at normal temperature for three months (90 days) in the same manner as in Example 4 with the state that the container had been subjected to taping with the sealing tape A.

The photomask blank substrates after storage was subjected to EB drawing, baking and developing in the same manner as in Example 1, and the obtained pattern was measured. As a result, the ΔCD value in Comparative example 6 was −4.7 nm, and it was influenced by the container.

Comparative Example 7

A photomask blank substrate container was produced in the same conditions as in Example 1 except for using an acrylonitrile-butadiene-styrene-based resin G as materials for the upper lid and the lower box of the container main body.

The total amount of the outgas of the acrylonitrile-butadiene-styrene polymer-based resin G was analyzed by GC-MS in the same manner as in Example 1. As a result, a total amount of detected outgas of the acrylonitrile-butadiene-styrene-based resin G was $5.9 \times 10^3$ ng in terms of n-tetradecane. Thus, the total amount of the outgas in the container was 8,234 μg.

The container main body of Comparative example 7 into which the photomask blank substrates had been contained was stored at normal temperature for three months (90 days) in the same manner as in Example 4 with the state that the container had been subjected to taping with the sealing tape A.

The photomask blank substrates after storage was subjected to EB drawing, baking and developing in the same manner as in Example 1, and the obtained pattern was measured. As a result, the ΔCD value in Comparative example 7 was −4.5 nm, and it was influenced by the container. The results of Comparative examples 1 to 7 were summarized in the following Table 2.

TABLE 2

| | | Comparative example 1 | Comparative example 2 | Comparative example 3 | Comparative example 4 | Comparative example 5 | Comparative example 6 | Comparative example 7 |
|---|---|---|---|---|---|---|---|---|
| Container main body (upper lid, lower box) | Sample Base resin | Resin E Polymethyl methacrylate-based | Resin A Polycarbonate-based | Resin A Polycarbonate-based | Resin A Polycarbonate-based | Resin A Polycarbonate-based | Resin F Acrylonitrile-butadiene-styrene-based | Resin G Acrylonitrile-butadiene-styrene-based |
| | Total amount of outgas (40° C. × 60 min)/ in terms of n-tetradecane ng | $2.0 \times 10^3$ | 18 | 18 | 18 | 18 | $5.2 \times 10^3$ | $5.9 \times 10^3$ |
| Inner member (inner cassette, retainer member) | Base resin | Polybutylene terephthalate-based | Polybutylene terephthalate-based | Polybutylene terephthalate-based | Polybutylene terephthalate-based | Polybutylene terephthalate-based | Polybutylene terephthalate-based | Polybutylene terephthalate-based |
| | Total amount of outgas (40° C. × 60 min)/ in terms of n-tetradecane ng | 9 | 9 | 9 | 9 | 9 | 9 | 9 |

TABLE 2-continued

| | | Comparative example 1 | Comparative example 2 | Comparative example 3 | Comparative example 4 | Comparative example 5 | Comparative example 6 | Comparative example 7 |
|---|---|---|---|---|---|---|---|---|
| | Total amount of outgas (100° C. × 20 min)/ in terms of n-tetradecane ng | $1.3 \times 10^2$ | $1.3 \times 10^2$ | $1.3 \times 10^2$ | $1.3 \times 10^2$ | $1.3 \times 10^2$ | $1.3 \times 10^2$ | $1.3 \times 10^2$ |
| Sealing tape | Sample | Sealing tape A | Sealing tape D | Sealing tape E | Sealing tape F | Sealing tape D | Sealing tape A | Sealing tape A |
| | Substrate | Polyethylene terephthalate-based | Polyvinyl chloride-based | Polyethylene-based | Polyethylene-based | Polyvinyl chloride-based | Polyethylene terephthalate-based | Polyethylene terephthalate-based |
| | Adhesive surface | Polyacrylic ester-based | Natural rubber-based | Polyacrylic ester-based | Polyacrylic ester-based | Natural rubber-based | Polyacrylic ester-based | Polyacrylic ester-based |
| | Total amount of outgas (150° C. × 10 min)/ in terms of n-tetradecane ng | $5.3 \times 10^2$ | $1.7 \times 10^4$ | $1.9 \times 10^3$ | $2.4 \times 10^3$ | $1.7 \times 10^4$ | $5.3 \times 10^2$ | $5.3 \times 10^2$ |
| Total amount of outgas in container μg | | 3032 | 37 | 37 | 37 | 37 | 7259 | 8234 |
| Total amount of outgas of tape μg | | 40 | 1291 | 144 | 182 | 1291 | 40 | 40 |
| Storage conditions | stored days/ day | 20 | 20 | 20 | 20 | 90 | 90 | 90 |
| | stored temperature/ ° C. | 40 | 40 | 40 | 40 | 23 | 23 | 23 |
| Line width changed amount ΔCD/nm | | 7.4 | −12.9 | −3.9 | −2.3 | −2.4 | −4.7 | −4.5 |

As shown in Table 2, in Comparative examples 1, 6 and 7, the total amounts of the outgas of the inner member and the sealing tape were a little, but the total amount of the outgas of the container main body was $2.0 \times 10^3$ ng or more in terms of n-tetradecane. Also, the total amount of the outgas in the container was $3.0 \times 10^3$ μg or more. Therefore, in Comparative examples 1, 6 and 7, it can be considered that the ΔCD value was worsened by the influence of the container, in particular, by the container main body.

In addition, in Comparative examples 2 to 5, a total amounts of outgas of the inner member and the container main body were a little, but the total amount of the outgas of the sealing tape was $1.9 \times 10^3$ ng or more in terms of n-tetradecane. Also, the total amount of the outgas of the tape was $1.4 \times 10^2$ μg or more. Therefore, in Comparative examples 2 to 5, it can be considered that the ΔCD value was worsened by the influence of the sealing tape.

On the other hand, as shown in Table 1, in Examples 1 to 8, the total amounts of the outgas of the container main body, the inner member and the sealing tape were each within the range of the present invention, so that worsening in the ΔCD value could be suppressed.

Such photomask blank substrate containers of the present invention are employed, it can be understood that the photomask blank substrates can be stored and transported while suppressing influence on the resist pattern by the volatile organic component generated from the container main body, the inner member and the sealing tape.

It must be stated here that the present invention is not restricted to the embodiments shown by the embodiments. The embodiments are merely examples so that any embodiments composed of substantially the same technical concept as disclosed in the claims of the present invention and expressing a similar effect are included in the technical scope of the present invention.

The invention claimed is:

1. A photomask blank substrate container for containing a photomask blank substrate, comprising
   an inner member having an inner cassette capable of containing the photomask blank substrate, and a retainer member for fixing the photomask blank substrate contained in the inner cassette from above,
   a container main body having a lower box capable of containing the inner cassette, and an upper lid capable of engaging with the retainer member to an inside, and
   a sealing tape for sealing the container main body,
   the lower box engaging with the upper lid directly,
   wherein the container main body and the inner member comprise a polymer-based material in which when 0.1 g of a sample thereof is retained at 40° C. for 60 minutes to release an outgas component, a total amount of the outgas detected by a gas chromatography mass spectrometer is 500 ng or less in terms of n-tetradecane, the sealing tape is a material in which when a size of 10 mm×10 mm of a sample thereof is retained at 150° C. for 10 minutes to release an outgas component, a total amount of the outgas detected by a gas chromatography mass spectrometer is $1.0 \times 10^3$ ng or less in terms of n-tetradecane, the photomask blank substrate is a material onto which a chemical amplification type resist has been coated, wherein the container main body comprises a polymer-based material containing a polycarbonate as a main component, and a surface resistance value thereof is $2.0 \times 10^4$ Ω/sq or less, and the sealing tape has: (i) a substrate comprising a polymer selected from the group consisting of polyethylene terephthalate, polypropylene and polyethylene, and (ii) an adhesive surface comprising polyacrylic ester.

2. The photomask blank substrate container according to claim 1, wherein the inner member comprises a polymer-based material in which when 2 g of a sample thereof is retained at 100° C. for 20 minutes to release an outgas component, the total amount of the outgas detected by a gas chromatography mass spectrometer is $1.0 \times 10^3$ ng or less in terms of n-tetradecane.

3. The photomask blank substrate container according to claim 1, wherein
a sum of a total amount of outgas by outgas component generated from an inner surface of the container main body, and a total amount of outgas by outgas component generated from a surface of the inner member is less than $3.0 \times 10^3$ μg, and
a total amount of outgas by outgas component generated from the sealing tape sealing the container main body is less than $1.4 \times 10^2$ μg.

4. The photomask blank substrate container according to claim 2, wherein
a sum of a total amount of outgas by outgas component generated from an inner surface of the container main body, and a total amount of outgas by outgas component generated from a surface of the inner member is less than $3.0 \times 10^3$ μg, and
a total amount of outgas by outgas component generated from the sealing tape sealing the container main body is less than $1.4 \times 10^2$ μg.

5. A method of storing a photomask blank substrate which comprises storing the photomask blank substrate with the photomask blank substrate contained in the photomask blank substrate container according to claim 1.

6. A method of transporting a photomask blank substrate which comprises transporting the photomask blank substrate with the photomask blank substrate contained in the photomask blank substrate container according to claim 1.

\* \* \* \* \*